(12) United States Patent
Wachter et al.

(10) Patent No.: US 8,828,807 B1
(45) Date of Patent: Sep. 9, 2014

(54) METHOD OF PACKAGING INTEGRATED CIRCUITS AND A MOLDED SUBSTRATE WITH NON-FUNCTIONAL PLACEHOLDERS EMBEDDED IN A MOLDING COMPOUND

(71) Applicant: Infineon Technologies AG, Neubiberg (DE)

(72) Inventors: Ulrich Wachter, Regenburg (DE); Dominic Maier, Pleystein (DE); Thomas Kilger, Regenstauf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/944,260

(22) Filed: Jul. 17, 2013

(51) Int. Cl.
*H01L 21/00* (2006.01)
*H01L 21/50* (2006.01)
*H01L 23/48* (2006.01)

(52) U.S. Cl.
CPC .............. *H01L 23/48* (2013.01); *H01L 21/50* (2013.01)
USPC .... 438/127; 438/107; 438/126; 257/E23.128; 257/668; 257/787

(58) Field of Classification Search
CPC ............... H01L 2924/01079; H01L 2924/14; H01L 2224/16
USPC .......... 257/E23.125, E23.128, 660, 676, 668, 257/787, 738, 773, 780, 786; 438/107, 112, 438/113, 124–127; 264/511
See application file for complete search history.

(56) References Cited

U.S. PATENT DOCUMENTS

| | | | | |
|---|---|---|---|---|
| 5,353,498 | A * | 10/1994 | Fillion et al. | 29/840 |
| 6,002,592 | A * | 12/1999 | Nakamura et al. | 361/760 |
| 7,161,252 | B2 * | 1/2007 | Tsuneoka et al. | 257/787 |
| 7,294,529 | B2 * | 11/2007 | Tuominen | 438/107 |
| 7,622,733 | B2 * | 11/2009 | Fuergut et al. | 257/40 |
| 7,915,089 | B2 * | 3/2011 | Fuergut et al. | 438/127 |
| 7,943,423 | B2 * | 5/2011 | Pohl et al. | 438/112 |
| 8,263,439 | B2 * | 9/2012 | Marimuthu et al. | 438/126 |
| 8,288,201 | B2 * | 10/2012 | Pagaila et al. | 438/107 |
| 8,318,540 | B2 * | 11/2012 | Beer | 438/113 |
| 8,372,695 | B2 * | 2/2013 | Park et al. | 438/114 |
| 8,378,466 | B2 * | 2/2013 | Chiu et al. | 257/660 |
| 8,390,107 | B2 * | 3/2013 | Meyer | 257/684 |

* cited by examiner

*Primary Examiner* — Chris Chu
(74) *Attorney, Agent, or Firm* — Murphy, Bilak & Homiller, PLLC (57) ABSTRACT

A method of packaging integrated circuits includes providing a molded substrate including a first plurality of functional semiconductor dies and a plurality of placeholders laterally spaced apart from one another and covered by a molding compound. The molding compound is thinned to expose at least some of the placeholders. The exposed placeholders are removed to form cavities in the molded substrate. A second plurality of functional semiconductor dies is inserted in the cavities formed in the molded substrate. Electrical connections are formed to the first plurality and second plurality of functional semiconductor dies at a side of the dies uncovered by the molding compound.

22 Claims, 9 Drawing Sheets

METHOD OF PACKAGING INTEGRATED CIRCUITS AND A MOLDED SUBSTRATE WITH NON-FUNCTIONAL PLACEHOLDERS EMBEDDED IN A MOLDING COMPOUND

FIELD OF TECHNOLOGY

The present application relates to packaging of integrated circuits, in particular molded substrates for packaging integrated circuits.

BACKGROUND

Embedded wafer level ball grid array (eWLB) is a packaging technology for integrated circuits (ICs) where the package interconnects are applied on an artificial wafer made of individual semiconductor dies (chips) and a molding compound. The semiconductor dies are embedded (overmolded) by the molding compound and therefore subjected to high processing temperatures used in the molding process. A redistribution layer is applied to a side of the eWLB wafer at which the pads of the dies are available. Electrical connections are formed between the die pads and the redistribution layer. Solder bumps are provided on the redistribution layer to enable package mounting after sawing of the eWLB wafer into individual IC packages.

Certain types of semiconductor dies can be mechanically and/or thermally damaged by the overmolding and redistribution layer processes of conventional eWLB technology. For example, MEMs (microelectromechanical systems) and SAW (surface acoustic wave) filters have mechanically sensitive surfaces which should not be overmolded to ensure proper operation. Contacting light emitting or sensing devices is difficult in eWLB technology because the electrical connections are typically implemented at the uncovered bottom side of the dies. Light emitting/sensing at the top of side of the dies is not feasible because the top side of the dies is encased by a molding compound in conventional eWLB technology, obstructing the light emitting/sensing surface of the dies. Also, the high processing temperatures employed during the overmolding and redistribution layer processes of conventional eWLB technology can damage certain temperature-sensitive dies.

SUMMARY

According to an embodiment of a method of packaging integrated circuits, the method comprises: providing a molded substrate including a first plurality of functional semiconductor dies and a plurality of placeholders laterally spaced apart from one another and covered by a molding compound; thinning the molding compound to expose at least some of the placeholders; removing the exposed placeholders to form cavities in the molded substrate; inserting a second plurality of functional semiconductor dies in the cavities formed in the molded substrate; and forming electrical connections to the first plurality and second plurality of functional semiconductor dies at a side of the dies uncovered by the molding compound.

According to an embodiment of a molded substrate, the molded substrate comprises a plurality of functional semiconductor dies and a plurality of non-functional placeholders embedded in a molding compound so that the functional semiconductor dies and the non-functional placeholders are spaced apart from one another and have a side uncovered by the molding compound. The molded substrate further comprises an insulation layer on the same side of the molding compound as the side of the functional semiconductor dies and the non-functional placeholders which is uncovered by the molding compound. The molded substrate also comprises a metal layer contacting pads of each functional semiconductor die through the insulation layer.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide cavities in a molded substrate for placing semiconductor dies such as light emitting and/or sensing devices within the molded substrate after overmolding and metal redistribution processes. As such, the semiconductor dies are not subjected to the higher temperatures associated with typical overmolding and metal redistribution processes. In addition, the top side of the semiconductor dies are not overmolded when placed in the cavities. This way, the top side of the dies remain unobstructed which is particularly beneficial for light emitting and/or sensing devices having electrical contacts at the bottom side and a light emitting/sensing surface at the top side.

Figure 1A:
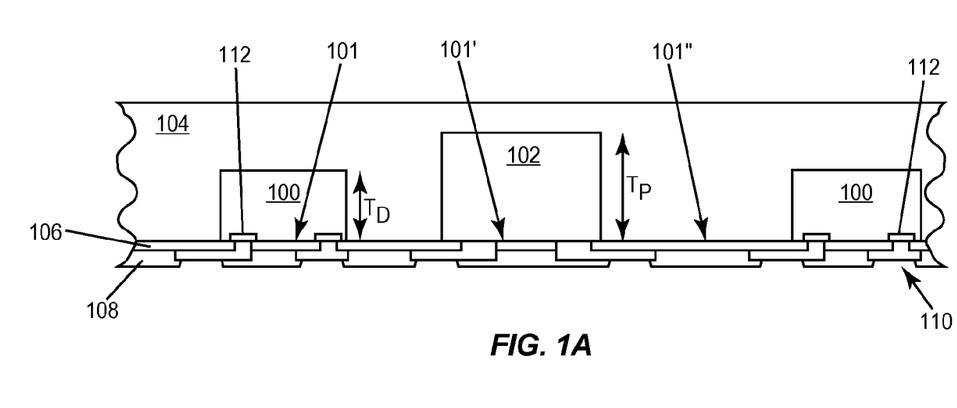
FIGS. 1A through 1F illustrate respective cross-sectional views of a molded substrate during different stages of a method of packaging integrated circuits using the molded substrate, according to an embodiment.

FIG. 1, which includes FIGS. 1A through 1F, illustrates cross-sectional views of a molded substrate during different stages of a method of packaging integrated circuits using the molded substrate, according to an embodiment. FIG. 1A shows the molded substrate which comprises a plurality of functional semiconductor dies 100 and a plurality of non-functional placeholders 102 embedded in a molding compound 104. As used herein, the term "functional semiconductor die" refers to a semiconductor die that includes active and/or passive devices capable of performing a regular function or functions and which is intended to be used as part of an integrated circuit. As used herein, the term "placeholder" refers to a material or structure used or included temporarily or as a substitute for a functional semiconductor die i.e. that which holds, denotes or reserves a place for a functional semiconductor die. The placeholders 102 can be non-functional semiconductor dies i.e. semiconductor dies which are not to be used as part of an integrated circuit. Alternatively or in addition, one or more of the placeholders 102 can be metal, plastic or ceramic blocks, a glob top epoxy, and/or porous blocks such as a ceramic die or etched silicon or other semiconductor material with deep trenches or holes.

In each case, the functional semiconductor dies 100 and the placeholders 102 are spaced apart from one another in the molding compound 104 and have a side 101, 101' uncovered by the molding compound 104. Any standard molding compound can be used such as the kind employed in conventional eWLB technology. For example, liquid or solid molding compounds can be used. At least some of the placeholders 102 can have a thickness ($T_P$) greater than the thickness ($T_D$) of the functional semiconductor dies 100. Alternatively, the placeholders 102 and the functional semiconductor dies 100 have the same thickness.

At least one insulation layer 106, 108 is provided on the same side 101" of the molding compound 104 as the side 101, 101' of the functional semiconductor dies 100 and the non-functional placeholders 102 which is uncovered by the molding compound 104. A metal redistribution layer 110 such as a copper redistribution layer contacts pads 112 of each functional semiconductor die 100 through openings in the insulation layer(s) 106, 108. In FIG. 1A, two insulation layers 106, 108 are shown. The first insulation layer 106 can be a polymeric material such as polyimide, WPR (a phenol-melamine-based novolac resin material), etc. The second insulation layer 108 can be any dielectric material suitable as a solder-stop material (for subsequent solder ball processing). The first insulation layer 106 can be omitted and the metal redistribution layer 110 directly formed on the backside 101" of the molding compound 104 and the uncovered side 100, 101' of the dies 102 and placeholders 104.

Figure 1B:
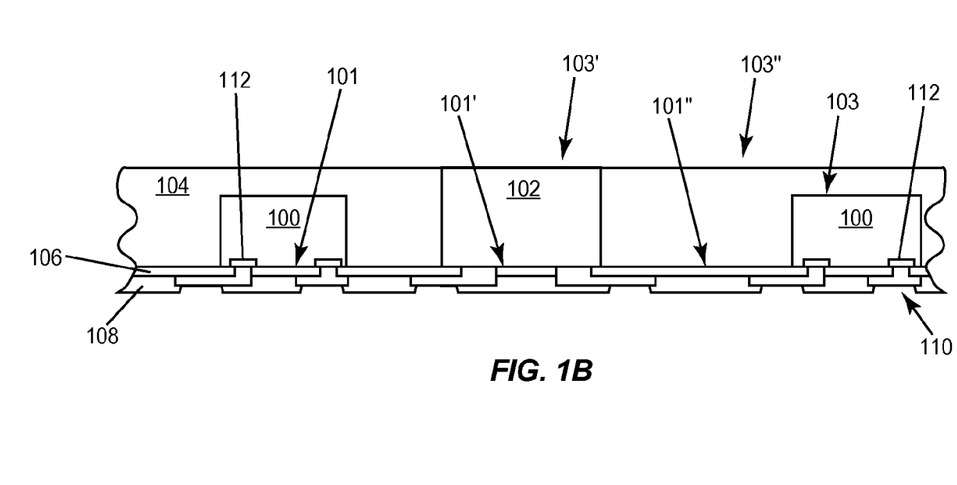

FIG. 1B shows the molded substrate after the molding compound 104 is thinned at the top side 103" of the molded substrate to expose at least some of the placeholders 102. The placeholders 102 are exposed at their top sides 103' which face away from the metal redistribution layer 110. According to this embodiment, the thinning process terminates before the top sides 103 of the functional semiconductor dies 100 are exposed so that the functional dies 100 remain covered by the molding compound 104 after thinning of the molding compound 104. Any suitable thinning process can be used such as etching or mechanical grinding. For example in the case of mechanical grinding, the exposed top sides 103' of the taller placeholders 102 can be detected by optical or visual inspection, by a change in the grinding speed owing to a material density difference between the molding compound 104 and the placeholders 102, by an auditory noise resulting from the grinding mechanism contacting the top side 103' of the placeholders 102, etc. The molding compound 104 can be over-etched i.e. the etching process continues after the exposed top sides 103' of the taller placeholders 102 can be detected.

Figure 1C:
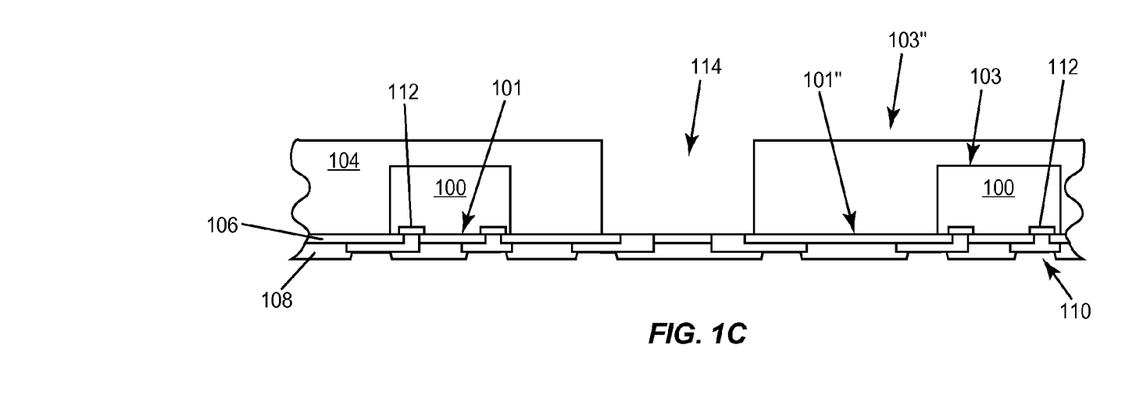

FIG. 10 shows the molded substrate after the exposed placeholders 102 are removed from the molded substrate to form cavities 114 in the molded substrate. Any suitable process can be used to remove the exposed placeholders 102 from the molded substrate such as chemical etching, laser etching, mechanical removal, etc. For example in the case of non-functional semiconductor die placeholders 102, wet chemical etching can be used to remove the non-functional semiconductor dies 102. In the case of the functional semiconductor dies 100 and the non-functional placeholders 102 both comprising the same semiconductor material such as silicon, at least some of the placeholders 102 have a greater thickness than the functional semiconductor dies 100 as shown in FIG. 1A so that the etching solvents employed etch away the placeholders 102 without harming the functional semiconductor dies 100. If the placeholders 102 are made of a different material than the functional semiconductor dies 100 e.g. made of plastic, the placeholders 102 and the functional semiconductor dies 100 can have the same thickness because the etchants can be selected so that the functional semiconductor dies 100 are not harmed even if uncovered by the molding compound 104 as a result of the molding compound thinning process.

Figure 1D:
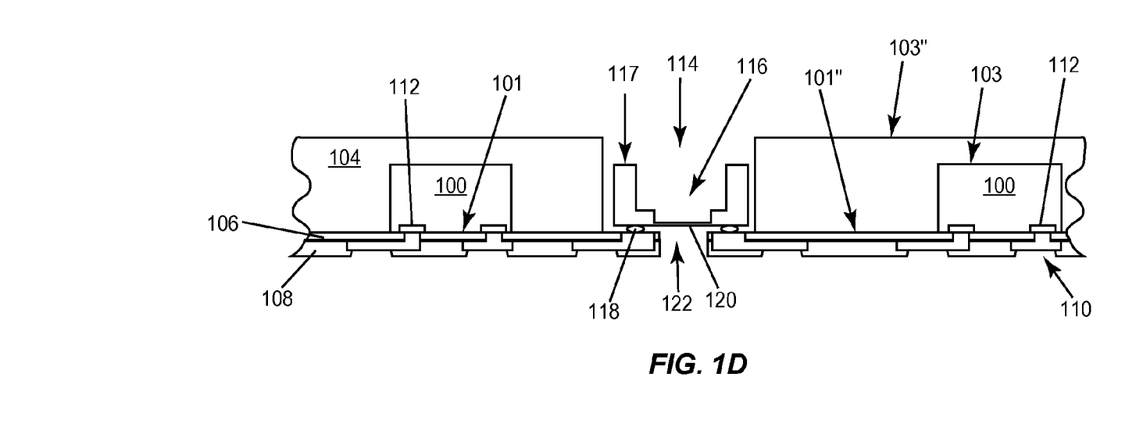

FIG. 1D shows the molded substrate after additional functional semiconductor dies 116 are placed in the cavities 114 formed in the molded substrate. The additional functional semiconductor dies 116 are electrically connected to the metal redistribution layer 110 by solder bumps or other electrical connectors 118. The metal redistribution layer 110 is designed to accommodate the electrical connections 118 of the additional functional semiconductor dies 116, and is patterned accordingly.

The additional functional semiconductor dies 116 preferably are dies which can be mechanically and/or thermally damaged by the prior overmolding and redistribution layer processes. For example, some or all of the newly added functional semiconductor dies 116 may require their top sides 117 to remain uncovered by the molding compound 104 e.g. in the case of SAW filters and MEMs dies. Also, some or all of the newly added functional semiconductor dies 116 may be damaged by the high processing temperatures employed during the prior overmolding and redistribution layer processes. In each case, adding these dies 116 after the overmolding and redistribution layer processes ensures the dies 116 are better protected and remain properly functional. A silicon microphone die is shown in FIG. 1D as one of the additional functional semiconductor dies 116. The silicon microphone die 116 has a membrane 120 for detecting sound signals. An opening 122 can be formed in the insulation layer(s) 106, 108 by standard processing such as etching. The opening 122 permits sound signals to impinge upon the membrane 120 of the silicon microphone die 116.

Figure 1E:
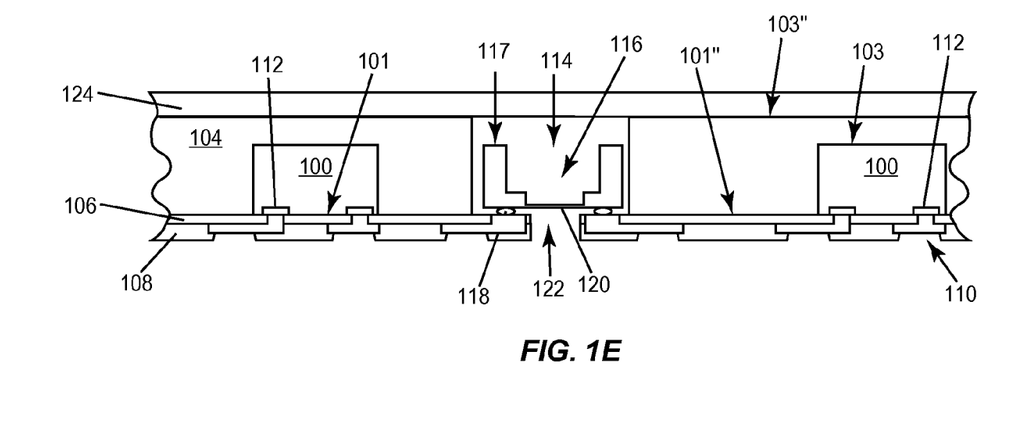

FIG. 1E shows the molded substrate after an optional lid 124 is applied to the thinned side 103" of the molding compound 104. The lid 124 is applied after the additional functional semiconductor dies 116 are inserted in the cavities 114 formed in the molded substrate so that the cavities 114 are covered by the lid 124. The lid 124 is a piece placed over the cavities 114 in the molded substrate to hold in, protect, or conceal the additional functional semiconductor dies 116. Any suitable lid for covering the cavities 114 can be used. In one embodiment, the lid 124 is an adhesive polymer foil. In the case of one or more of the additional functional semiconductor dies 116 being a SAW filter, the SAW filter is enclosed by the lid 124 and the molding compound 104 to prevent dust and other debris from gathering on the SAW filter die 116. Also, the cavity 114 in which the SAW filter 116 is positioned defines a certain open volume for the SAW filter 116. In the case of one or more of the additional functional semiconductor dies 116 being operable to detect or emit light (e.g. in the case of an LED or photodiode), the lid 1214 can be translucent so that the light-sensitive die(s) 116 can detect or emit light through the translucent lid 124.

Figure 1F:
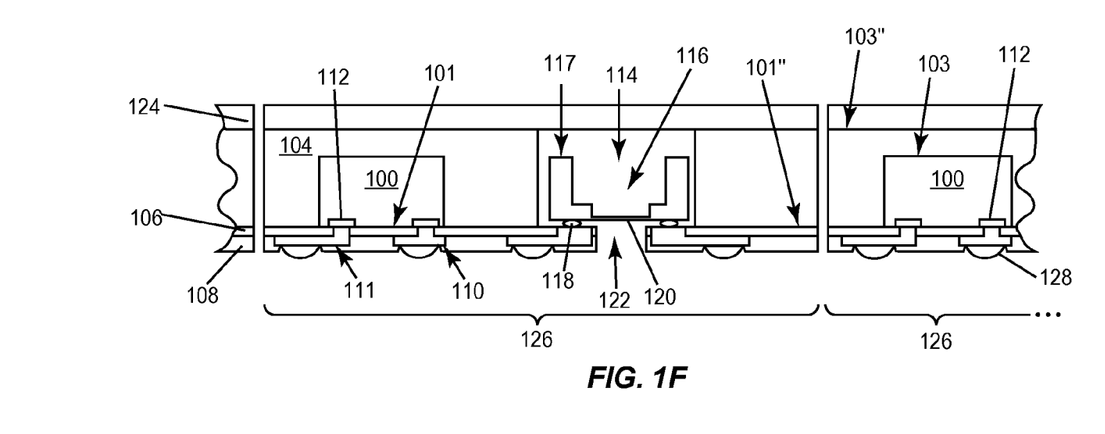

FIG. 1F shows the molded substrate after sawing into individual IC packages 126. Any standard sawing or molded substrate segmentation process can be employed. Solder bumps 128 can applied to the side 111 of the metal redistribution layer 110 facing away from the molding compound 104, before or after sawing of the molded substrate. The solder bumps 128 enable mounting of the individual IC packages 126 e.g. on a circuit board or other type of substrate (not shown for ease of illustration). Any standard solder bump process can be employed.

Figure 2:
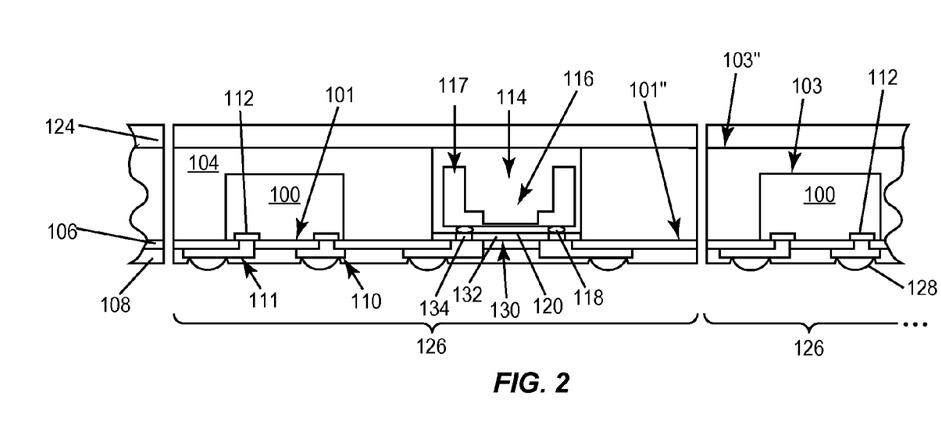
FIG. 2 illustrates a cross-sectional view of the molded substrate according to another embodiment.

FIG. 2 illustrates a cross-sectional view of the molded substrate, according to another embodiment. The embodiment shown in FIG. 2 is similar to the embodiment shown in FIG. 1F, however, one or more of the additional (later-added) functional semiconductor dies 116 is attached to a carrier 130. The carrier 130 has an electrically insulating region 132 such as a ceramic or laminate and electrically conductive regions 134 embedded in the insulating region 132. The conductive regions 134 of the carrier 130 are connected to the solder bumps 118 of the corresponding die 116 at one side and to the metal redistribution layer 110 at the opposing side, enabling electrical connections between the metal redistribution layer 110 and the device(s) included in the additional die 116.

Figure 3:
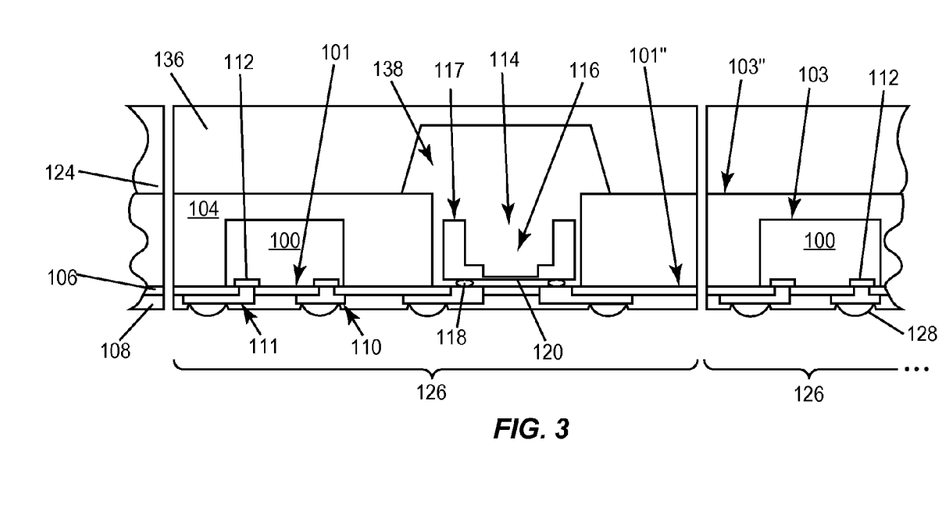
FIG. 3 illustrates a cross-sectional view of the molded substrate according to yet another embodiment.

FIG. 3 illustrates a cross-sectional view of the molded substrate, according to yet another embodiment. The embodiment shown in FIG. 3 is similar to the embodiment shown in FIG. 1F, however, a capping substrate 136 having an open cavity 138 is applied to the thinned side 103" of the molding compound 104. The open cavity 138 in the capping substrate 136 aligns with the cavity 114 in the molded substrate which contains one of the additional functional dies 116. In the case of a microphone die, the open cavity 138 in the capping substrate 136 enlarges the open volume around the microphone die 116. Any suitable capping substrate can be used e.g. such as a molded substrate.

Figure 4A:
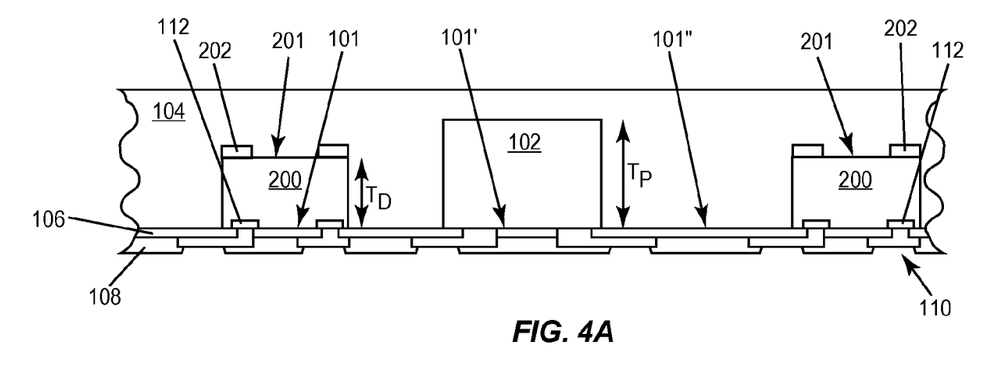
FIGS. 4A through 4D illustrate respective cross-sectional views of a molded substrate during different stages of a method of packaging integrated circuits using the molded substrate, according to another embodiment.

FIG. 4, which includes FIGS. 4A through 4D, illustrates cross-sectional views of a molded substrate during different stages of a method of packaging integrated circuits using the molded substrate, according to another embodiment. The embodiment shown in FIG. 4A is similar to the embodiment shown in FIG. 1A, however, one or more of the placeholders 102 are interposed between semiconductor blocks 200 embedded in the molding compound 104. Electrically conductive regions 202 such as copper bumps are disposed on the top side 201 of the semiconductor blocks 200 i.e. the side of the semiconductor blocks 200 facing away from the metal redistribution layer 110.

Figure 4B:
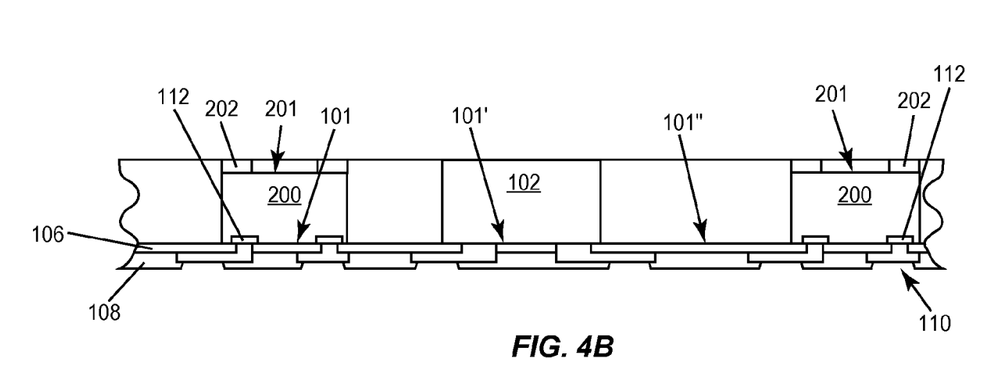

FIG. 4B shows the molded substrate after the molding compound 104 is thinned at the top side of the molded substrate to expose at least some of the placeholders 102, as previously described herein. The electrically conductive regions 202 on the top side 201 of the semiconductor blocks 200 are also exposed after the thinning.

Figure 4C:
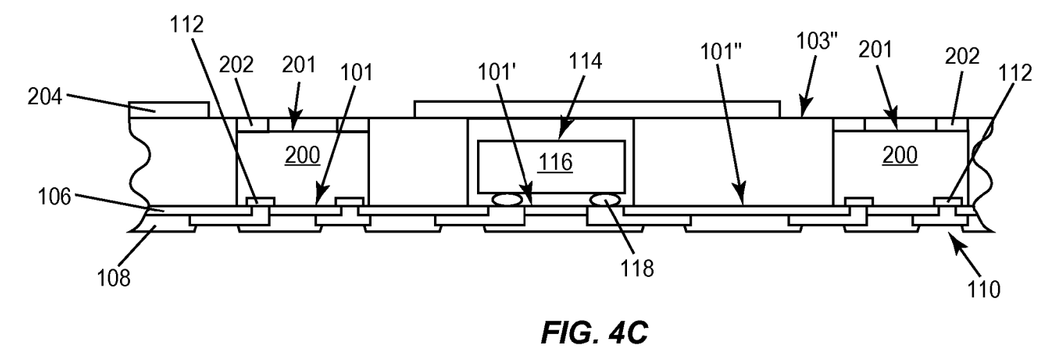

FIG. 4C shows the molded substrate after the placeholders 102 are removed, a SAW filter 116 is placed in the corresponding cavity 114 in the molding compound 104, and a structured lid 204 is applied to the thinned side 103" of the molding compound 104. The lid 204 is structured so that the SAW filter 116 is covered by the lid 204 and the semiconductor blocks 200 are uncovered by the lid 204. The lid 204 can be structured before or after application to the thinned side 103" of the molding compound 104.

Figure 4D:
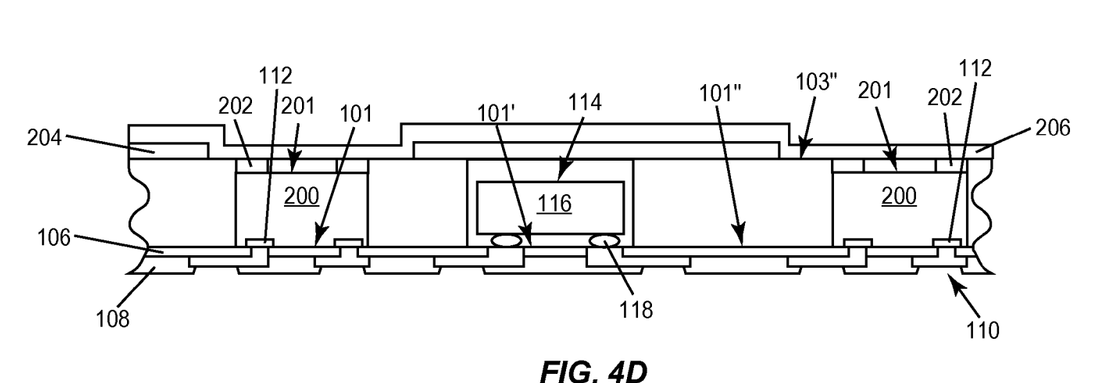

FIG. 4D shows the molded substrate after a shielding layer 206 such as a copper metal layer is formed e.g. by sputtering on the structured lid 204 and the thinned side 103" of the molding compound 104. The shielding layer 206 is spaced apart from the SAW filter 116 by the structured lid 204 and electrically connected to the exposed electrically conductive regions 202 at the top side 201 of the semiconductor blocks 200. The shielding layer 206 is connected to the metal redistribution layer 110 by the semiconductor blocks 200, forming a shielding structure for the SAW filter 116.

Figures 5A, 5B:
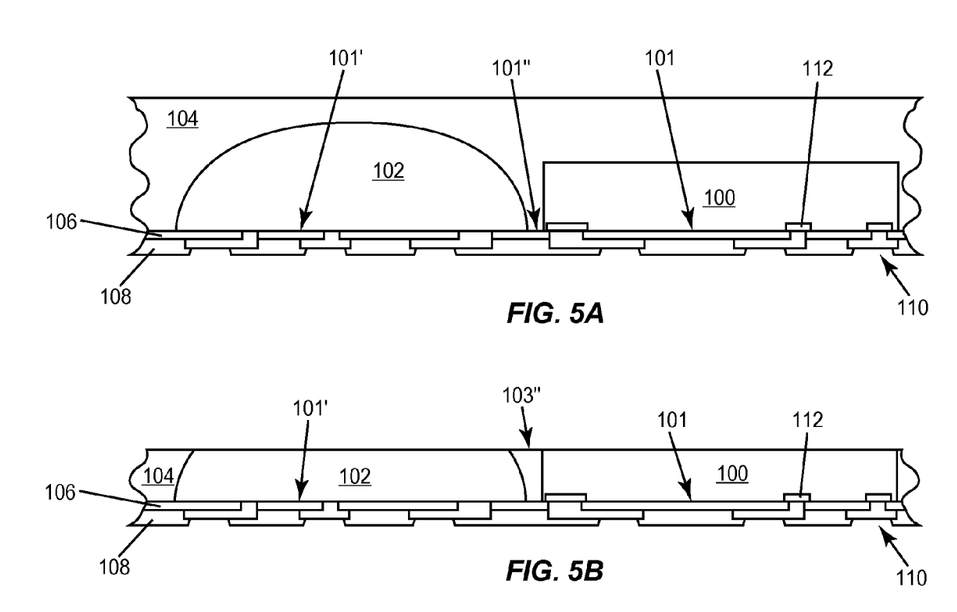
FIGS. 5A through 5C illustrate respective cross-sectional views of a molded substrate during different stages of a method of packaging integrated circuits using the molded substrate, according to yet another embodiment.
Figure 5C:
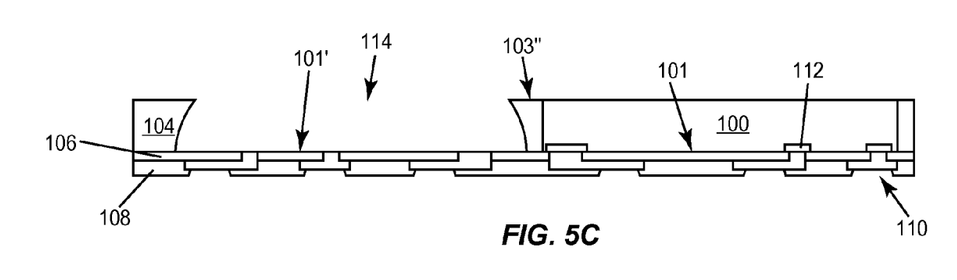

FIG. 5, which includes FIGS. 5A through 5C, illustrates cross-sectional views of a molded substrate during different stages of a method of packaging integrated circuits using the molded substrate, according to yet another embodiment. In FIG. 5A, the placeholders 102 comprise a glob top epoxy of a greater (as shown) or same thickness as the functional semiconductor dies 100 embedded in the molding compound 104. FIG. 5B shows the molded substrate after the molding compound 104 is thinned at the top side 103" of the molding compound 104 to expose the glob top epoxy placeholders 102, as previously described herein. FIG. 5C shows the molded substrate after the glob top epoxy placeholders 102 are removed e.g. by chemical etching to form cavities 114 in the molding compound 104. Additional functional semiconductor dies 116 can be placed in the cavities 114 and further processing of the molded substrate performed as previously explained herein.

Figure 6A:
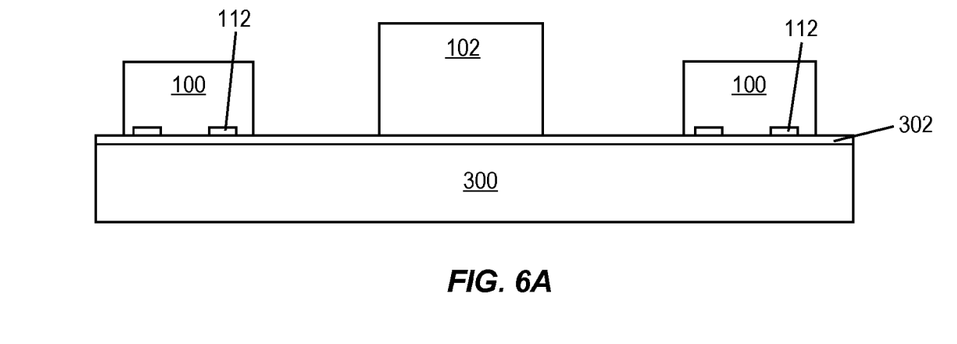
FIGS. 6A through 6C illustrate respective cross-sectional views of a molded structure during different stages of manufacturing, according to an embodiment.
Figure 6B:
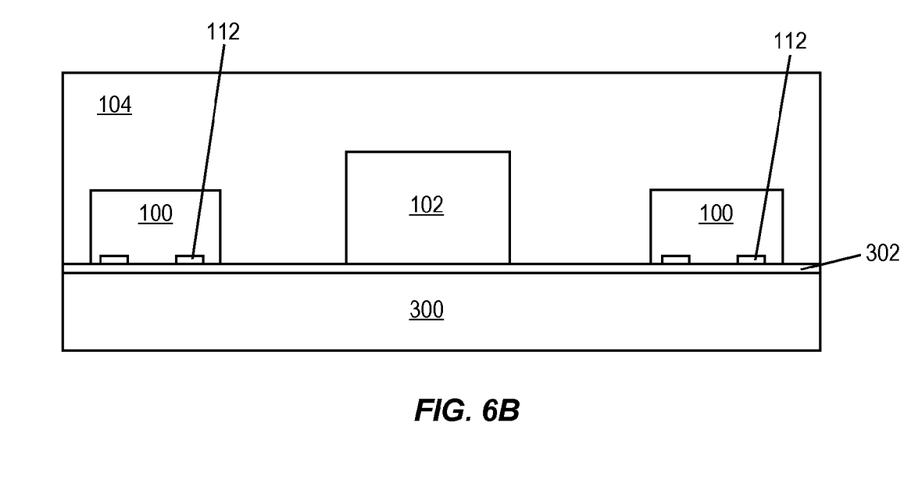
Figure 6C:
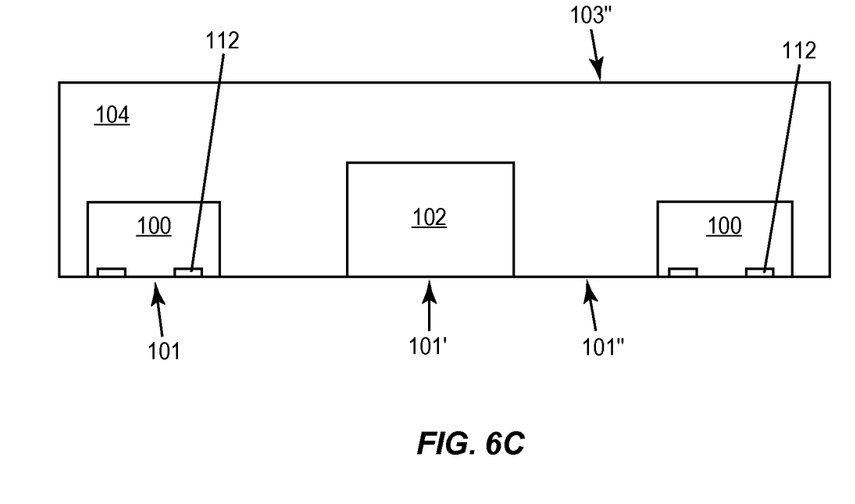

The molded substrate described herein can be manufactured in various ways. FIGS. 6A through 6C illustrate one embodiment of manufacturing the molded substrate.

FIG. 6A shows a plurality of functional semiconductor dies 100 and placeholders 102 placed on a support substrate 300. The support substrate 300 provides mechanical support to the dies 100 and placeholders 102 during subsequent molding and metallization processes. The functional semiconductor dies 100 and placeholders 102 are spaced apart from one another on the support substrate 300. An adhesive film 302 can be used to hold the functional semiconductor dies 100 and placeholders 102 in place on the support substrate 300.

FIG. 6B shows the functional semiconductor dies 100 and placeholders 102 after being covered with a molding compound 104 to form a molded structure. Any suitable molding process and compound can be used.

FIG. 6C shows the molded structure after the support substrate 300 and adhesive film 302 are removed. The support substrate 300 and adhesive film 302 can be removed using any standard process such as etching or grinding, after the functional semiconductor dies 100 and placeholders 102 are covered with the molding compound 104. The bottom sides 100, 101' of the functional semiconductor dies 100 and placeholders 102 are uncovered by the molding compound 104. Subsequent thinning of the molding compound 104 to expose the placeholders 102 as previously described herein is performed at the side 103" of the molding compound 104 opposite from which the support substrate 300 was removed. The metal redistribution layer 110 is formed on the same side 101" of the molding compound 104 at which the pads 112 of each functional semiconductor die 100 are uncovered by the molding compound 104.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of packaging integrated circuits, the method comprising:
   providing a molded substrate including a first plurality of functional semiconductor dies and a plurality of placeholders laterally spaced apart from one another and covered by a molding compound;
   thinning the molding compound to expose at least some of the placeholders;
   removing the exposed placeholders to form cavities in the molded substrate;
   inserting a second plurality of functional semiconductor dies in the cavities formed in the molded substrate; and
   forming electrical connections to the first plurality and second plurality of functional semiconductor dies at a side of the dies uncovered by the molding compound.

2. The method of claim 1, wherein providing the molded substrate comprises:
   placing the first plurality of functional semiconductor dies and the placeholders on a support substrate so that the first plurality of functional semiconductor dies and the placeholders are spaced apart from one another on the support substrate;
   covering the first plurality of functional semiconductor dies and the placeholders with the molding compound to form a molded structure; and
   removing the support substrate after the first plurality of functional semiconductor dies and the placeholders are covered with the molding compound.

3. The method of claim 2, wherein thinning the molding compound to expose the placeholders comprises thinning the molding compound at a side of the molded structure opposite from which the support substrate was removed to expose the placeholders.

4. The method of claim 1, wherein the exposed placeholders are thicker than the first plurality of functional semiconductor dies and wherein the molding compound is thinned by etching or mechanical grinding so that the first plurality of functional semiconductor dies remain covered by the molding compound after the thinning.

5. The method of claim 1, wherein the exposed placeholders are non-functional semiconductor dies of a greater thickness than the first plurality of functional semiconductor dies.

6. The method of claim 5, wherein the non-functional semiconductor dies are removed by wet chemical etching.

7. The method of claim 1, wherein the exposed placeholders are metal, plastic or ceramic blocks.

8. The method of claim 1, wherein the exposed placeholders comprise a glob top epoxy.

9. The method of claim 1, wherein the exposed placeholders are porous blocks.

10. The method of claim 1, further comprising applying a lid to the thinned side of the molding compound after the second plurality of functional semiconductor dies are inserted in the cavities formed in the molded substrate so that the cavities are covered by the lid.

11. The method of claim 10, wherein the lid is an adhesive polymer foil.

12. The method of claim 10, wherein the lid is translucent and one or more of the second plurality of functional semiconductor dies are operable to detect or emit light through the translucent lid.

13. The method of claim 10, wherein one or more of the second plurality of functional semiconductor dies is a surface acoustic wave filter enclosed by the lid and the molding compound.

14. The method of claim 13, wherein each surface acoustic wave filter is interposed between semiconductor blocks embedded in the molded substrate, and wherein the lid is structured so that the semiconductor blocks are uncovered by the lid.

15. The method of claim 14, further comprising forming a shielding layer on the structured lid and the thinned side of the molding compound, the shielding layer being spaced apart from each surface acoustic wave filter by the structured lid and electrically connected to exposed electrically conductive regions disposed on the semiconductor blocks.

16. The method of claim 1, wherein forming the electrical connections comprises:
   forming an insulation layer on a side of the molded substrate at which pads of each functional semiconductor die are uncovered by the molding compound; and
   forming a metal layer that contacts pads of each functional semiconductor die through the insulation layer.

17. The method of claim 16, wherein one or more of the second plurality of functional semiconductor dies is attached to a carrier and electrically connected to the metal layer through the carrier.

18. The method of claim 16, wherein one or more of the second plurality of functional semiconductor dies is a microphone die, the method further comprising forming an opening in the insulation layer which permits sound signals to impinge upon a membrane of the microphone die.

19. The method of claim 18, further comprising applying a capping substrate having an open cavity to the thinned side of the molding compound so that the open cavity in the capping substrate aligns with the cavity in the molded substrate which contains the microphone die and enlarges an open volume around the microphone die.

20. The method of claim 18, wherein the exposed placeholders are removed after the metal layer is formed.

21. A molded substrate, comprising:
   a plurality of functional semiconductor dies and a plurality of non-functional placeholders embedded in a molding compound so that the functional semiconductor dies and the non-functional placeholders are spaced apart from one another and have a side uncovered by the molding compound;
   an insulation layer on the same side of the molding compound as the side of the functional semiconductor dies and the non-functional placeholders which is uncovered by the molding compound; and
   a metal layer contacting pads of each functional semiconductor die through the insulation layer.

22. The molded substrate of claim 21, wherein at least some of the non-functional placeholders have a greater thickness than the functional semiconductor dies.

* * * * *